United States Patent
Cader et al.

(10) Patent No.: US 11,153,992 B2
(45) Date of Patent: Oct. 19, 2021

(54) AIR AND FLUID COOLING OF A DATA CENTER

(71) Applicant: HEWLETT PACKARD ENTERPRISE DEVELOPMENT LP, Houston, TX (US)

(72) Inventors: Tahir Cader, Liberty Lake, WA (US); Wade D Vinson, Houston, TX (US); Douglas Kent Garday, Mesa, AZ (US); John P Franz, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 16/716,573

(22) Filed: Dec. 17, 2019

(65) Prior Publication Data
US 2020/0146182 A1    May 7, 2020

Related U.S. Application Data

(62) Division of application No. 15/329,246, filed as application No. PCT/US2014/049320 on Jul. 31, 2014, now Pat. No. 10,548,242.

(51) Int. Cl.
*H05K 7/20* (2006.01)
*H05K 7/14* (2006.01)
*G06F 1/20* (2006.01)

(52) U.S. Cl.
CPC ........... *H05K 7/20381* (2013.01); *G06F 1/20* (2013.01); *G06F 1/206* (2013.01); *H05K 7/1497* (2013.01);
(Continued)

(58) Field of Classification Search
CPC ........... H05K 7/20381; H05K 7/20836; H05K 7/1497; H05K 7/20827; H05K 7/20745;
(Continued)

(56) References Cited

U.S. PATENT DOCUMENTS

| | | | |
|---|---|---|---|
| 5,327,739 A * | 7/1994 | Ingersoll | B60H 3/022 62/78 |
| 7,289,326 B2 | 10/2007 | Heydari et al. | |

(Continued)

FOREIGN PATENT DOCUMENTS

| | | |
|---|---|---|
| KR | 101276380 | 6/2013 |
| TW | 201338687 | 9/2013 |

(Continued)

OTHER PUBLICATIONS

Search Report and Written Opinion received for PCT Application No. PCT/US2014/049320, dated Apr. 24, 2015, 10 pages.

(Continued)

*Primary Examiner* — Steve S Tanenbaum
(74) *Attorney, Agent, or Firm* — Hewlett Packard Enterprise Patent Department

(57) ABSTRACT

An apparatus is provided herein. The apparatus includes a sensor module and a control module. The sensor module to receive a measured environmental condition. The control module to use the measured environmental condition to determine a fluid temperature to cool a first set of components and determine an air temperature to cool a second set of components.

10 Claims, 8 Drawing Sheets

(52) U.S. Cl.
CPC ..... H05K 7/20354 (2013.01); H05K 7/20745 (2013.01); H05K 7/20827 (2013.01); H05K 7/20836 (2013.01); *G06F 2200/201* (2013.01); *Y02D 10/00* (2018.01)

(58) Field of Classification Search
CPC .. H05K 7/20354; H05K 7/20387; G06F 1/20; G06F 1/206; G06F 2200/201
USPC .......................................................... 62/93
See application file for complete search history.

(56) References Cited

U.S. PATENT DOCUMENTS

| | | | |
|---|---|---|---|
| 8,583,290 | B2 | 11/2013 | Campbell et al. |
| 2008/0212282 | A1 | 9/2008 | Hall et al. |
| 2009/0126909 | A1 | 5/2009 | Ellsworth et al. |
| 2010/0010678 | A1 | 1/2010 | Dawson et al. |
| 2010/0154448 | A1 | 6/2010 | Hay |
| 2010/0188816 | A1* | 7/2010 | Bean, Jr. ............ H05K 7/20745 361/696 |
| 2012/0006038 | A1* | 1/2012 | Sharma ............. H05K 7/20745 62/97 |
| 2012/0103591 | A1* | 5/2012 | Tozer ................. H05K 7/20836 165/281 |
| 2012/0125028 | A1 | 5/2012 | Keisling et al. |
| 2012/0136487 | A1* | 5/2012 | Lin .................... G05D 23/1932 700/276 |
| 2012/0211198 | A1 | 8/2012 | Kinkel et al. |
| 2012/0300391 | A1 | 11/2012 | Keisling et al. |
| 2013/0233532 | A1 | 9/2013 | Imwalle et al. |
| 2013/0264045 | A1 | 10/2013 | Chainer et al. |
| 2014/0053588 | A1 | 2/2014 | Karrat et al. |
| 2014/0063730 | A1 | 3/2014 | Hay |
| 2014/0151003 | A1 | 6/2014 | Chapel et al. |

FOREIGN PATENT DOCUMENTS

| | | |
|---|---|---|
| TW | 201414408 | 4/2014 |
| TW | 201423343 | 6/2014 |

OTHER PUBLICATIONS

Kennedy, D., "Rittal White Paper 507: Understanding Data Center Cooling Energy Usage & Reduction Methods," Feb. 11, 2009.

* cited by examiner

AIR AND FLUID COOLING OF A DATA CENTER

BACKGROUND

Electronic devices have temperature requirements. Heat from the use of the electronic devices is controlled using cooling systems. Examples of cooling systems include air and liquid cooling.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Electronic system designs must balance conflicts between power density, spatial layout, temperature requirements, acoustic noise, and other factors. Air cooling systems typically use heat sinks and fans to remove heat from the system. The use of heat sinks and fans increase the electrical power required to operate an electronic device in an electronic system, and may cause excessive acoustic noise and lower system density. Liquid cooling can be more efficient than air cooling; however, the liquid cooling typically includes plumbing connections within the electronic devices. As the liquid goes through the plumbing connections the risk of leakage of liquid within the electronic device is introduced.

In examples, a control apparatus is provided. The control apparatus includes a sensor module and a control module. The sensor module to receive a measured environmental condition. The control module to use the measured environmental condition to determine a fluid temperature to cool a first set of components and determine an air temperature to cool a second set of components. The control apparatus provides a fluid or liquid cooing solution to enable the deployment of data centers in a variety of environments. The control apparatus provides an efficient cooling solution for racks that accommodate low to high power densities.

The phrase "environmental condition" refers to a measurable value in the air surrounding the electronic components, such as outdoor air, indoor air, or both. For example, an air temperature, a dry bulb temperature, a wet bulb temperature, a dew point, a relative humidity, an altitude, a pollution level, or a wind speed.

The phrase "electronic component" refers to a computing device such as a server, blade server, server cartridge that provides computer solutions, storage solutions, network solutions and/or cloud services.

The phrase "modular data center" refers to a data center with interchangeable modules. For example, the modular data center may include a performance optimized data center (POD), a collection of racks like a modular cooling system (MCS), or a collection of warm water cooled racks like a supercomputer, or a high performance computing (HPC) duster, that includes server modules, network solutions, and/or storage modules.

Figure 1:
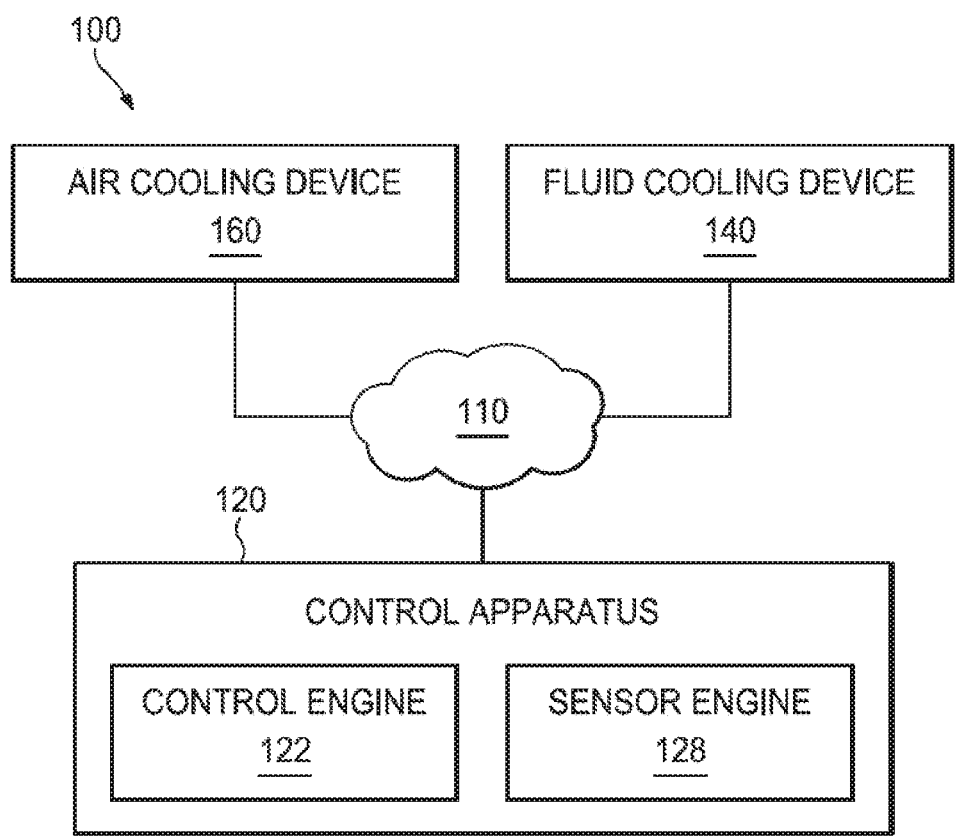
FIG. 1 illustrates a block diagram of a system according to an example.

FIG. 1 illustrates a block diagram of a system 100 to cool a modular data center. The system 100 includes a fluid cooling device 140, an air cooling device 160, and a control apparatus 120. The fluid cooling device 140 to cool a first set of components of the modular data center using a fluid cooling loop. The air cooling device 160 to provide air to cool a second set of components of the modular data center. The control apparatus 120 connected to the air cooling device 160 and the fluid cooling device 140 via, for example, a link 110.

The control apparatus 120 to determine an air cooling temperature for the air cooling loop based on an environmental condition, and determine a fluid cooling temperature for the fluid cooling loop based on the environmental condition. The environmental condition may include, for example, an air temperature and a relative humidity. For example, the control apparatus 120 may include a control engine 122 and a sensor engine 128. The sensor engine 128 represents generally a combination of hardware and/or programming to receive a measured environmental condition. The control engine 122 represents generally a combination of hardware and/or programming to use the measured environmental condition, such as the air temperature and the relative humidity to determine the fluid cooling temperature to cool a first set of components and the air cooling temperature to cool a second set of components. The control apparatus 120 to also transmit an air signal to the air cooling device 160 to set the air cooling temperature, and transmit a fluid signal to the fluid cooling device 140 to set the fluid cooling temperature. For example, the air signal and the fluid signal may be transmitted by the control engine 122, the sensor engine 128, and/or an additional module, such as a communication module (not shown).

The link 110 may represent generally one or more of a cable, wireless, fiber optic, and/or remote connections via a telecommunication link, an infrared link, a radio frequency link, or any other connectors or systems that provide electronic communication. The link 110 may include, at least in part, an intranet, the Internet, or a combination of both. The link 110 may also include intermediate proxies, routers, switches, load balancers, and the like.

Figure 2:
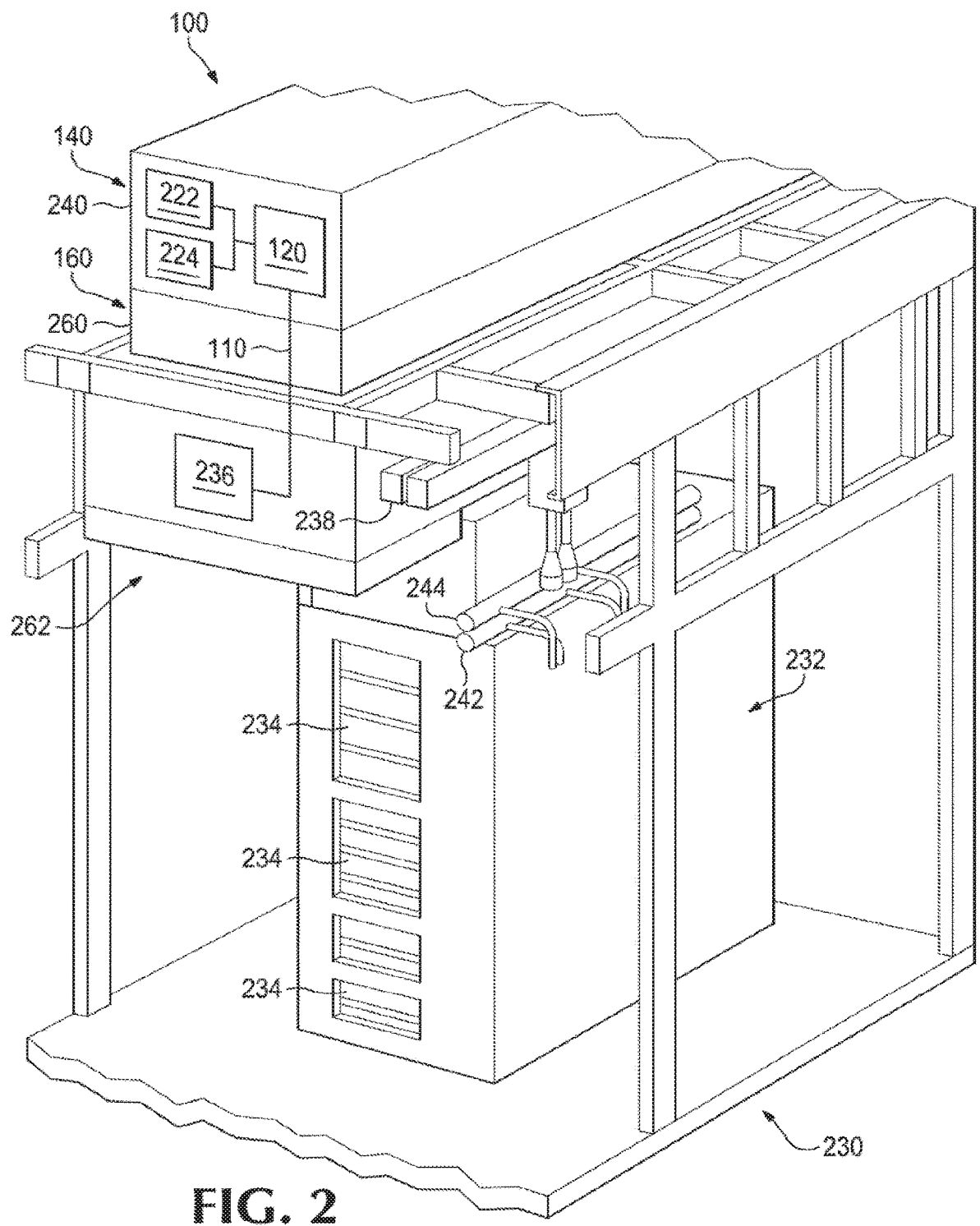
FIGS. 2-4 illustrate the system of FIG. 1 according to examples.
Figure 3:
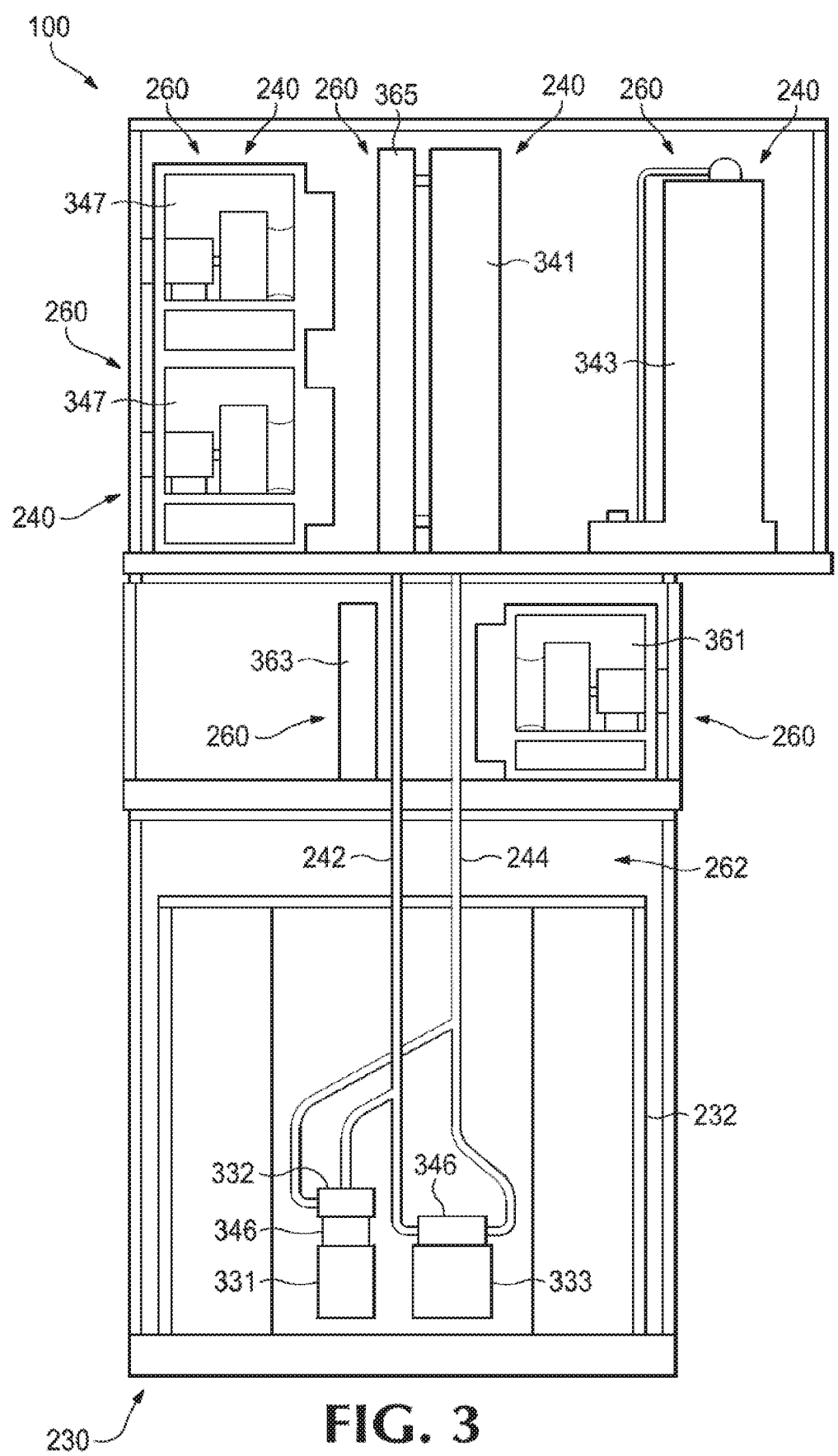
Figure 4:
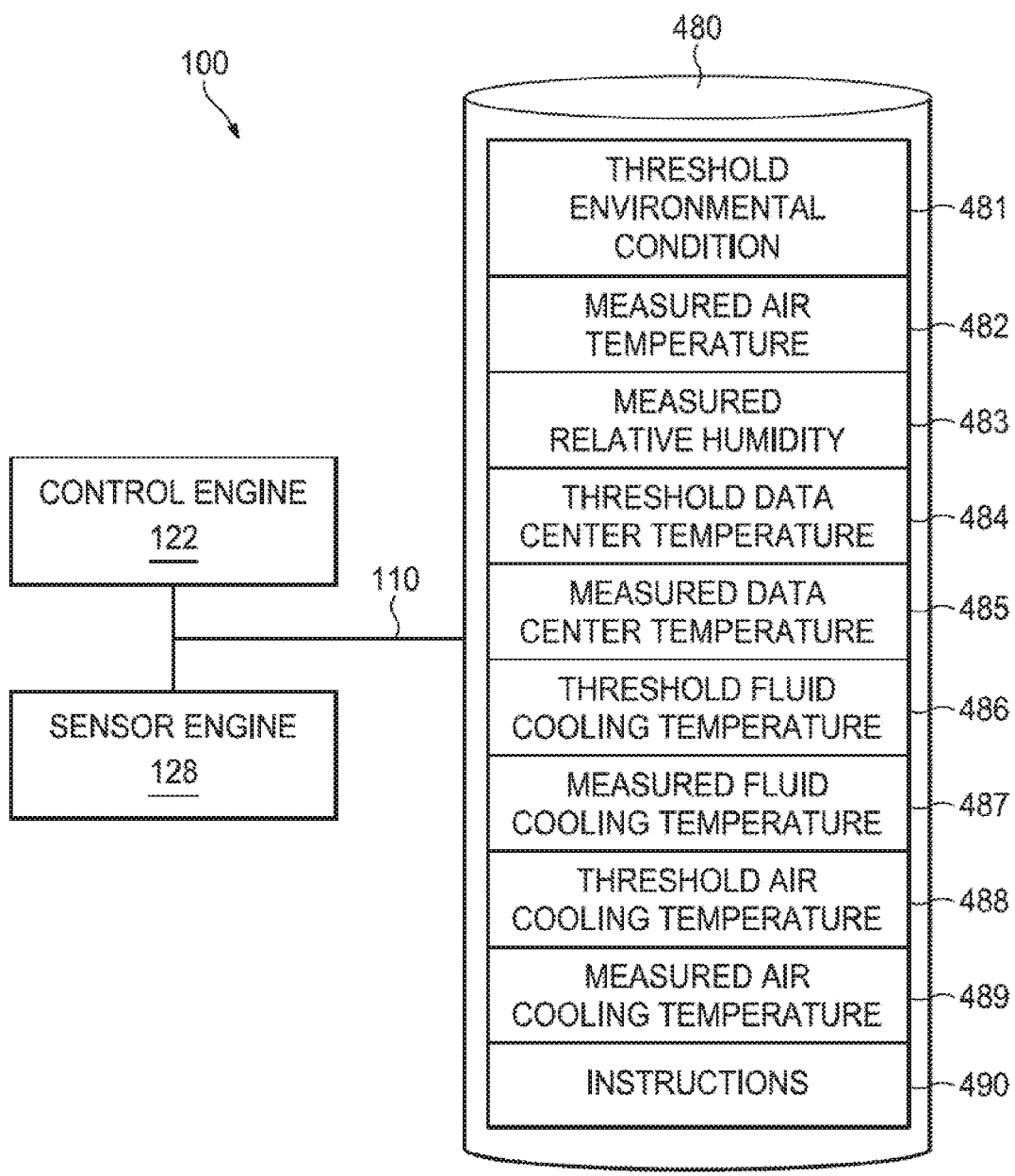

FIGS. 2-4 illustrate the system 100 of FIG. 1 according to examples. Referring to FIG. 2, a perspective view of the system 100 of FIG. 1 is illustrated according to the example. The system 100 includes a control apparatus 120, the fluid cooling device 140, and the air cooling device 160 connected to a modular data center 230. The modular data center 230 as illustrated includes a rack 232, a set of electronic components or modules 234 in the rack 232, a controller 236, and a power bus bar 238 to deliver power to the racks. For example, the modular data center 230 may include a performance optimized data center (POD), a collection of racks like a modular cooling system (MCS), or a collection of warm water cooled racks like a supercomputer, or an HPC cluster, that includes server modules, network solutions, and/or storage modules.

The control apparatus 120 may be connected to the data center 230 via the controller 236. The controller 236 may be connected to the electronic components, such as modules 234, i.e., server modules, storage modules, and/or network switches, and the rack 232. The control apparatus 120, the fluid cooling device 140, and the air cooling device 160 may be connected to one another and/or the modular data center 230 via the link 110 that may include cables, wireless connection, fiber optic connection, and/or other electronic connectors.

The control apparatus 120 determines an air cooling temperature based on an environmental condition, such as an air temperature and a relative humidity, and determines a fluid cooling temperature based on the environmental condition, i.e. the air temperature and the relative humidity. For example, the air temperature may be measured using an air temperature sensor 222. The relative humidity may be measured using a humidity sensor 224. The control apparatus 120 to also transmit an air signal to the air cooling device 160 to set the air cooling temperature, and transmit a fluid signal to the fluid cooling device 140 to set the fluid cooling temperature. For example the air cooling temperature may be set to thirty degrees Celsius and the fluid cooling temperature may be set to forty degrees Celsius. The control apparatus 120 may update the air cooling temperature at predetermined intervals via the air signal, and the control apparatus 120 may update the fluid cooling temperature at predetermined intervals via the fluid signal. The updates to the air cooling temperature and the fluid cooling temperature may be based on new measurements of the environmental condition, such as the air temperature and the relative humidity obtained by the control apparatus 120.

The control apparatus 120 may use the air temperature sensor 222 to obtain a measured air temperature and the humidity sensor 224 to obtain a measured relative humidity from an environment surrounding the system 100, such as by measurement of weather or environmental conditions outside the data center and/or the air inside the data center. The air temperature and the relative humidity may be received or obtained at predetermined intervals to provide sufficient updates to the system 100.

Referring to FIGS. 2-3, the fluid cooling device 140 may include, for example, an adiabatic fluid cooler (AFC) 240 that supplies water to cold plates that provide component level cooling, such as cooling of central processing units (CPUs), dual in-line memory modules (DIMMs), and/or graphics processing units (GPUs) using the fluid. By using the fluid cooling device 140 for a first set of components that provide a high heat load, such as the CPUs, DIMMs, and/or GPUs, a percentage of the rack heat load may be managed and cooled using the fluid cooling device 140. The actual percentage may be determined based on the environmental conditions. For example, approximately seventy to ninety percent of the rack heat load. The fluid may provide component level cooling, which, for example, allows rack heat to go directly to non-chilled water and relieves air flow for data centers and reduces the amount of air flow needed. By using component-level cooling and by reducing the demand for air flow, a smaller air handler, such as a smaller DX unit 260, may be utilized. This can also eliminate the need for outside air, for instance, in areas of high pollution. For example, the fluid may be provided to the cold plates via a fluid supply 242 and returned to the AFC 240 via a fluid return 244. Component level cooling using a fluid requires less power, which reserves more power for use by the electronic components. The additional power for the electronic components provides the ability to deploy racks and data centers with higher power densities. For example, power densities exceeding eighty kilowatts per rack in a chiller-less environment or where small amounts of mechanical cooling through, for example, a DX unit 260, are beneficial, such as in high altitude areas where heat absorption by air cooling is reduced. Moreover, the system 100 with a chiller-less environment provides autonomous heat removal that does not require an external water cooling system.

The cross-sectional view of the system 100 of FIG. 1 is illustrated in FIG. 3 with the AFC 240 including a fluid supply 242 and the fluid return 244 to connect the AFC 240 to cold plates 346. For example, the cold plates 346 may be connected to DIMMs 331 and CPUs 333 to provide component level fluid cooling. The DIMMs 331 may further include DIMM covers 332.

The fluid cooling device 140 is illustrated as an AFC 240 that provides or distributes the fluid to the components via the fluid supply 242. For example, the temperature of the fluid may be forty degrees Celsius. The system's 100 ability to maintain a fluid temperature of forty degrees Celsius provides efficiency with cooling. The fluid supply 242 provides the cold plates 346 with the fluid to cool the components by distributing the fluid across or through the cold plates 346. The fluid then carries the heat extracted from the components out of the cold plates 346 through the fluid return 244. The system 100 may further include fluid connectors for the fluid supply 242 and the fluid return 244 to connect the fluid cooling device 140 to the electronic components or modules 234. The fluid may include water and/or other liquids, oils, or gases that may be used in a fluid loop to cool components.

The fluid return 244 returns the fluid to the AFC 240, which extracts the heat from the water. For example, the AFC 240 is illustrated in FIG. 3 to include a liquid to air heat exchanger 341 and a wet media 343. The wet media 343 evaporatively cools the air before it passes over the liquid to air heat exchanger 341. The air-liquid heat exchanger may include a condenser coil 365. For example, water may be dripped on a media with air blowing over the water with fans 347 to cause the water to evaporate and provide a cooler, more humid air. The wet media 343 may alternatively be replaced with a cooler evaporative media. The fluid may include for example, a loop that recycles the fluid and reuses the fluid to maintain a constant temperature of electronic components or modules 234 and of the data center 230.

The air cooling device 160 is illustrated below the fluid cooling device 140 in FIGS. 2-3. For example, the air cooling device 160 may include a mechanical cooling-device such as a direct expansion compressor-based unit (DX) or chiller unit 260. The DX 260 may be positioned above a cold aisle 262 in the modular data center 230. The DX 260 may include direct expansion air handling units 361 and an evaporator coil 363 to provide air cooling to a second set of components. The fluid cooling device 140 and the air cooling device 160 may share the wet media 343, the condenser coil 365, and the fans 347.

For example, the DX 260 may provide air cooling for a small percentage of the components, such as the components that are not cooled using the fluid cooling device 140. For example, approximately ten to thirty percent of the components may be cooled via air cooling; however, the actual percentage may be determined based on environmental conditions. The temperature of the air delivered may be, for example, thirty degrees Celsius. Moreover, the first set of components and the second set of components may be distinct groups of components. For example, the system 100 may provide component-level fluid or liquid cooling for the devices that produce the most heat, such as CPUs, DIMMs, and GPUs, i.e., the first set of components, and air cooling for the balance of the components, such as hard drives, power supplies, host bus adapters, supporting power regulation for CPU, GPU, and/or DIMMs and other board related logic ASICs, i.e., the second set of components. Additionally, the component-level fluid or liquid cooling may be extended to cool other components, such as power supplies, network chips, and hard drives. However, the system 100 may also use both fluid cooling and air cooling on at least one of the same components, such that at least one of the first set of the components and at least one of the second set of components are cooled using both air and fluid.

FIG. 4 illustrates a portion of the system 100 of FIG. 1. The control engine 122 and the sensor engine 128 of the control apparatus 120 are illustrated linked 110 to a data store 480. The control engine 122 functionalities are accomplished via the link 110 that connects the control engine 122, the sensor engine 128, and the data store 480.

The data store 480 represents generally any memory configured to store data accessible by the control engine 122 and/or the sensor engine 128 in the performance of their functions. The data store 480 is, for example, a database that stores, threshold environmental conditions 481, such as a threshold air temperature and a threshold relative humidity to compare to measured air temperatures 482, measured relative humidity 483, threshold data center temperatures 484, measured data center temperatures 485, threshold fluid cooling temperatures 486, measured fluid cooling temperatures 487, threshold air cooling temperatures 488, measured air cooling temperatures 489, and instructions 490 to perform the functions of the control engine 122 and the sensor engine 128.

The sensor engine 128 to send data to and receive data from a fluid cooling device 140 and an air cooling device 160 The sensor engine 128 may also receive information regarding environmental conditions, such as the air temperature outside a data center or the air temperature within the data center using sensors. For example, the sensor engine may include temperature sensors, humidity sensors, pressure sensors, and/or flow sensors.

The control engine 122 to send data to and receive data from a fluid cooling device 140. The control engine 122 to manage a set of fluid cooling components. The set of fluid cooling components to cool the at least one electronic component, such as CPUs, DIMMs, and/or GPUs. For example, the set of fluid cooling components may include a pump, an electromechanical valve, a heat exchange loop, a leak detector, an air blower, louvers, and/or a sensor. The control engine 122 to also send data to and receive data from an air cooling device 160. The air cooling device 160 to manage a set of air cooling components. The set of air cooling components to cool the second set of components, such as hard drives, power supplies, host bus adapters, supporting power regulation for CPU, GPU, and/or DIMMs and other board related logic ASICs. The set of air cooling components may include a heat exchanger, a fan, a heat sink, and/or a sensor.

Figure 5:
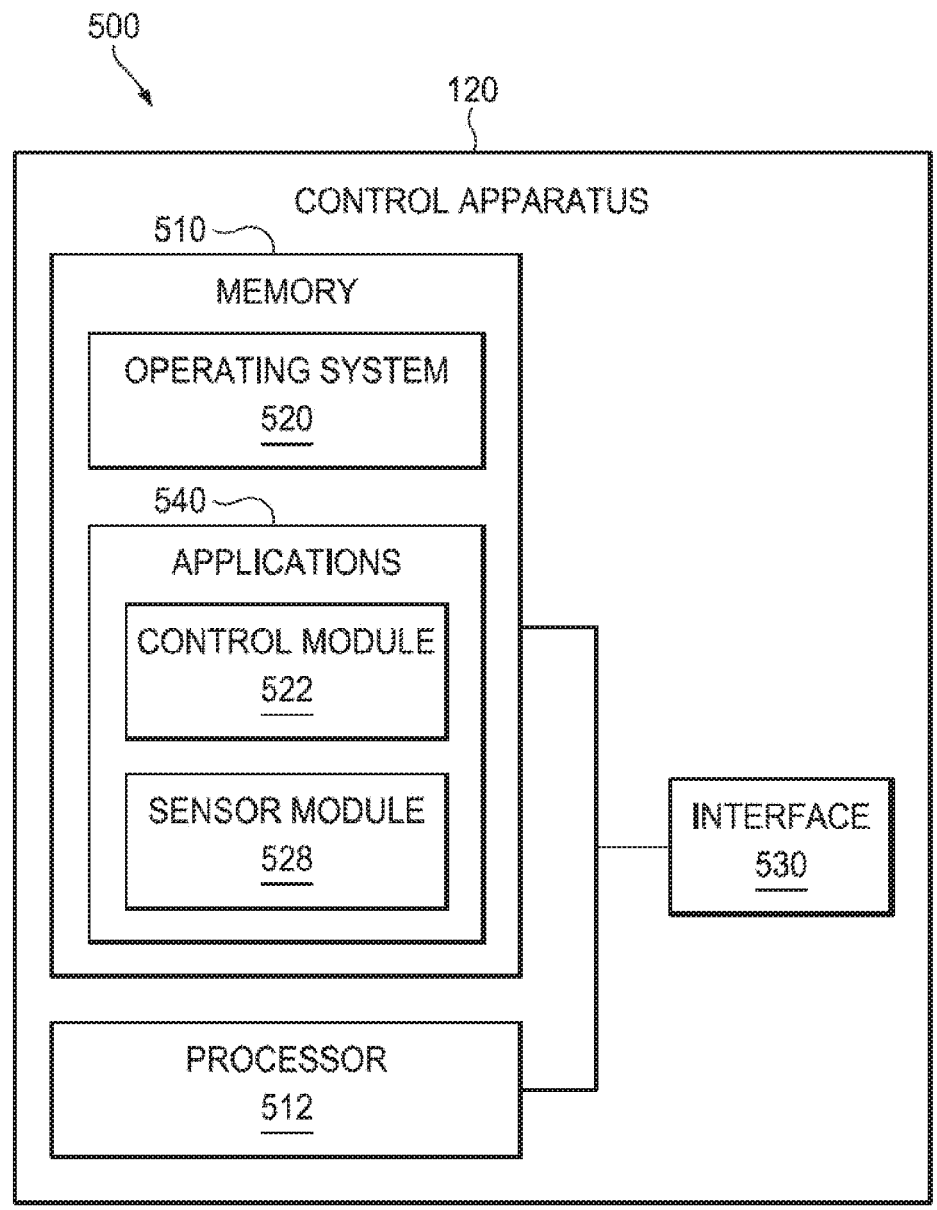
FIG. 5 illustrates a block diagram of a control apparatus according to an example.

FIG. 5 illustrates a block diagram of a control apparatus 120 according to an example. The control apparatus 120 may include firmware or a computer readable medium 500 that interfaces a fluid cooling device 140 and an air cooling device 160. The control apparatus 120 is illustrated to include a memory 510, a processor 512, and an interface 530. The memory 510 stores a set of instructions. The processor 512 is coupled to the memory 510 to execute the set of instructions 490. The processor 512 represents generally any processor configured to execute program instructions stored in memory 510 to perform various specified functions. The interface 530 represents generally any interface enabling the control apparatus 120 to communicate with the control engine 122, the sensor engine 128, and/or the data store 480 via the link 110, as illustrated in FIG. 5.

The memory 510 is illustrated to include an operating system 520 and applications 540. The operating system 520 represents a collection of programs that when executed by the processor 512 serves as a platform on which applications 540 run. Examples of operating systems 520 include various versions of Microsoft's Windows® and Linux®. Applications 540 represent program instructions that when executed by the processor 512 function as an application that when executed by a processor 512 control the fluid cooling device 140 and the air cooling device 160.

For example, FIG. 5 illustrates a control module 522 and a sensor module 528 as executable program instructions stored in memory 510 of the control apparatus 120. The sensor module 528, when executed, receives a measured environmental condition, both of which may be used to determine the fluid temperature and the air temperature.

The control module 522, when executed determines an air cooling temperature and a fluid cooling temperature based on the environmental condition, such as the air temperature and the relative humidity. The control module 522 and/or the sensor module 528 may transmit a fluid signal and an air signal to set the fluid cooling temperature and the air cooling temperature. For example, the set of instructions enable the control engine 122 and/or the sensor engine 128 to communicate with the fluid cooling device 140 to set the fluid temperature and communicate with the air cooling device 160 to set the air temperature. The control module 522 may also determine a flow rate for an air loop that circulates the air temperature and a fluid loop that circulates the fluid temperature. Additional considerations incorporated into the instructions may include adjusting the air temperature, the fluid temperature, and/or the flow rates for the air loop and the fluid loop based on a work load. For example, the control module 522 may further include a workload value to adjust the fluid temperature and the air temperature based on a workload.

The set of instructions 490 facilitate the transmission of data to, from, and between the control module 522 and the sensor module 528. For example, the set of instructions 490 are executed to send data and receive data, such as threshold environmental conditions 481, i.e., a threshold air temperature, a threshold relative humidity, a threshold wet bulb temperature, a threshold dry bulb temperature, a threshold dew point, a threshold altitude, threshold pollution level and/or a threshold wind speed; measured environmental conditions, such as measured air temperatures 482, measured relative humidity 483; threshold data center temperatures 484, measured data center temperatures 485, threshold fluid cooling temperatures 486, measured fluid cooling temperatures 487, threshold air cooling temperatures 488, measured air cooling temperatures 489. In an example, the control module 522 may analyze the measured air temperatures 482, measured relative humidity 483, measured data center temperatures 485, measured fluid cooling temperatures 487, and/or measure air cooling temperatures 489 and based on the data determine a fluid cooling temperature for the fluid cooling loop and an air cooling temperature. The information related to the fluid cooling temperature and the air cooling temperature may then be communicated to the fluid cooling device 140 and/or the air cooling device 160 via the control module 522 and/or sensor module 528. The information may be communicated via a signal transmission to the fluid cooling device 140 and/or the air cooling device 160 and the information may be in the form of a setting, an adjustment to the fluid cooling device 140 and/or the air cooling device 160.

Referring back to FIG. 1, the control engine 122 and the sensor engine 128 of the control apparatus 120 are described as combinations of hardware and/or programming. As illustrated in FIG. 5, the hardware portions include the processor 512. The programming portions include the operating system 520, applications 540, and/or combinations thereof. For example, the control module 522 represents program instructions 490 that when executed by a processor 512 cause the implementation of the of the control engine 122. The sensor module 528 represents program instructions 490 that when executed by a processor 512 cause the implementation of the sensor engine 128.

The programming of the control module 522 and sensor module 528 may be processor 512 executable instructions stored on a memory 510 that includes a tangible memory media and the hardware includes a processor 512 to execute the instructions. The memory 510 may store program instructions that when executed by the processor 512 cause the processor 512 to perform the program instructions. The memory 510 is integrated in the same device (or system) as the processor 512 or it is separate but accessible to that device (or system) and processor 512.

In some examples, the program instructions may be part of an installation package that can be executed by the processor 512 to perform a method using the system 100. The memory 510 is a portable medium such as a CD, DVD, or flash drive or a memory maintained by a server from which the installation package can be downloaded and installed. In some examples, the program instructions may be part of an application or applications already installed on a computing device. In further examples, the memory 510 includes integrated memory, such as a hard drive.

Figure 6:
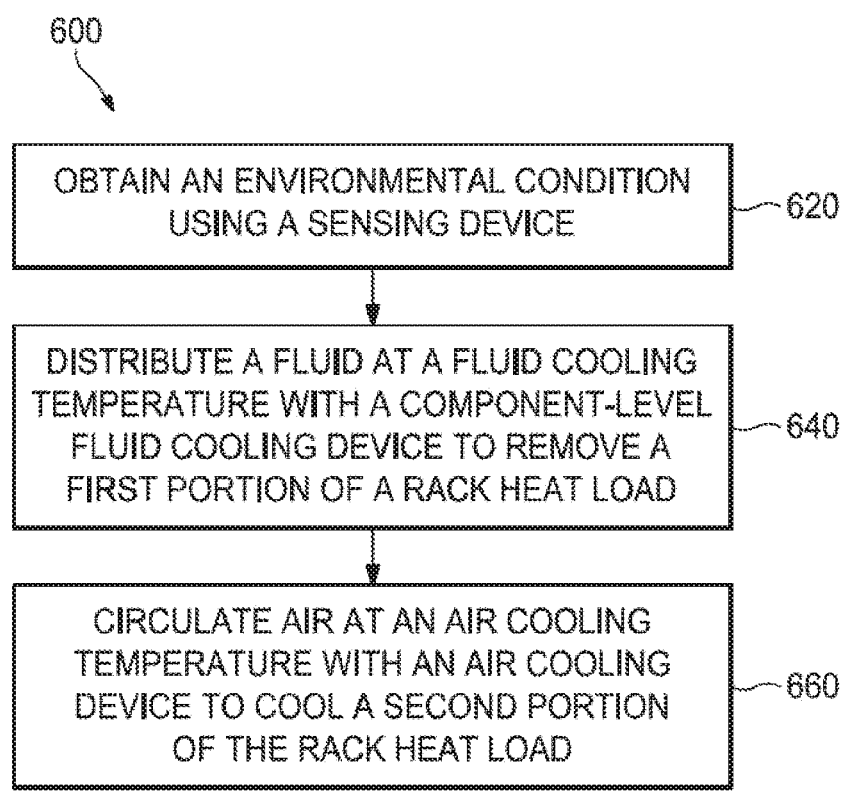
FIGS. 6-7 illustrate flow charts of methods to maintain a temperature of a data center according to examples.
Figure 7:
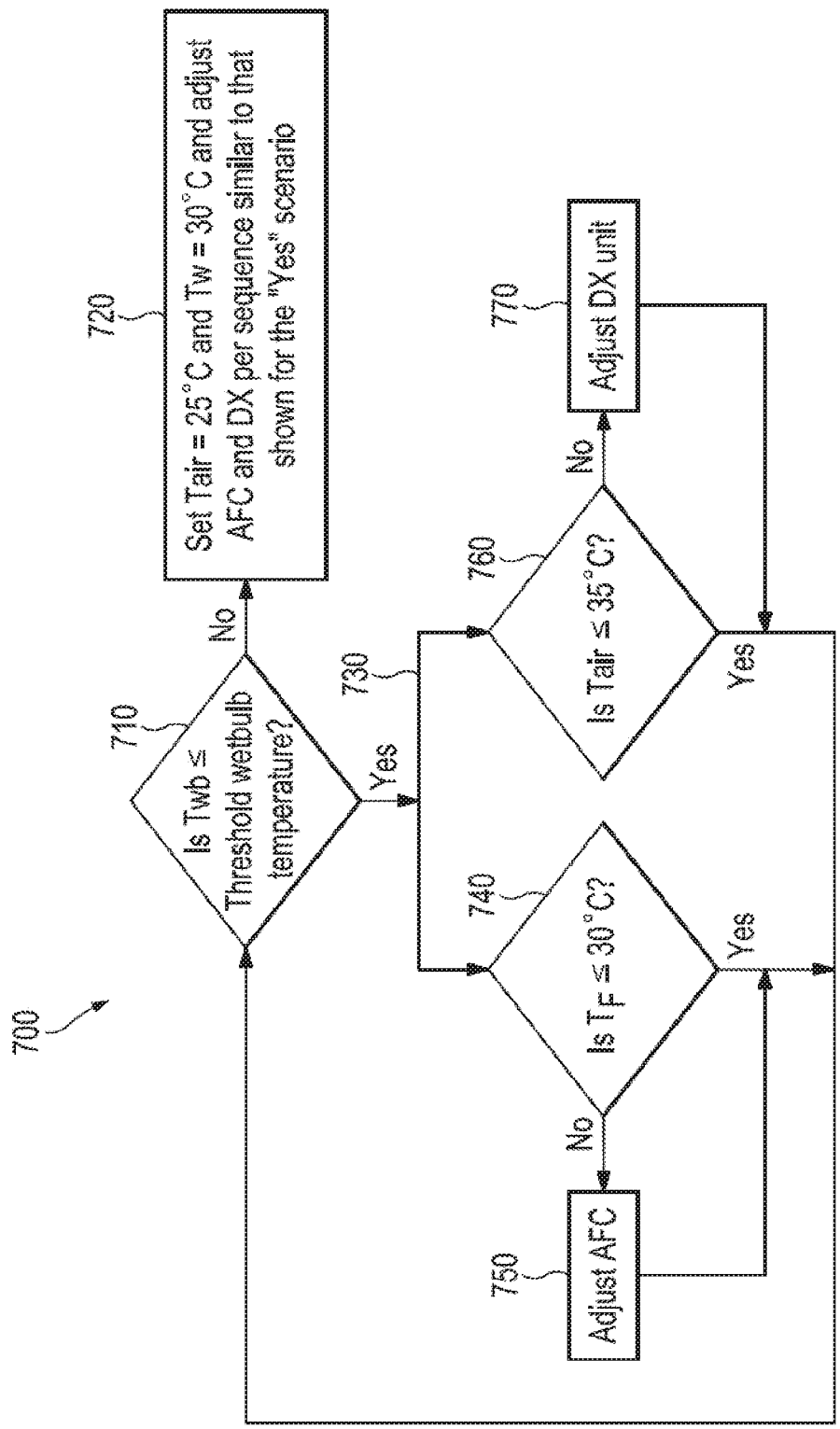

FIGS. 6-7 illustrate flow charts of methods to maintain a temperature of a data center according to examples. Referring to FIG. 6, a method 600 to cool a modular data center is provided. The method 600 obtains an environmental condition using a sensing device in block 620. For example, the environmental condition may include the air temperature and the relative humidity, which may be used to determine a wet bulb temperature. In block 640, a fluid is distributed at a fluid cooling temperature via a component-level fluid cooling device to remove a first portion of a rack heat load. The fluid cooling temperature may be determined by the control apparatus based on the comparison of a threshold environmental condition and a measured environmental condition. Air is circulated at an air cooling temperature by an air cooling device to cool a second portion of the rack heat load in block 660. The air cooling temperature may be provided by a control apparatus and determined based on the comparison of the threshold environmental condition and the measured environmental condition.

The fluid cooling temperature, the air cooling temperature, and/or flow rates may also be adjusted based on a variety of factors. For example, workload information may be manually entered through an input device or determined based on the operation and functions within the data center.

Moreover, adjustments may be made to manual entry to environmental conditions, for example, if a sudden change in the environmental conditions or weather is expected, manual adjustments may be made to adjust the control of the data center preemptively. Furthermore, adjustments may be made manually or automatically to adjust the air and fluid levels. For example, the amount of heat the air is exposed to may be adjusted. Other adjustments may be made in response to power supplies and energy considerations. The adjustments may be further made to influence the control apparatus' functionality by modifying the determinations made for the air cooling device and the fluid cooling device and/or override the determinations of the control apparatus. These adjustments whether made automatically or manually, may impact the start-up, the operation, and/or the shutdown of the system.

The method 600 may further include dynamically measuring and updating the air temperature and the fluid temperature as illustrated in the flow chart 700 of FIG. 7. For example, a measured wet bulb temperature may be compared to a threshold wet bulb in block 710. If the measured wet bulb temperature is greater than the threshold wet bulb temperature, the air cooling temperature is set to a determined air temperature, such as twenty-five degrees Celsius; and the fluid cooling temperature is set to a determined fluid cooling temperature, such as thirty degrees Celsius, as illustrated in block 720.

Else, if the measured wet bulb temperature is less than or equal to the threshold wet bulb temperature, the flow chart moves to block 730. In block 730, the temperature of the fluid in the AFC and the air in the cold aisle is analyzed. In block 740, a measured fluid temperature is compared to a fluid temperature threshold. For example, if the measured fluid temperature is less than or equal to thirty degrees Celsius go back to block 710. If the measure fluid temperature is greater than thirty degrees Celsius, then adjust the AFC in block 750. The AFC may be adjusted by first setting a water flow rate for the evaporative cooling and the flow rate through the heat exchanger. Next, set the water bypass past the heat exchanger and set the blower speed. Then, re-measure the measured fluid temperature and repeat any of the above steps.

In block, 760, the measured air temperature is compared to an air temperature threshold. For example, if the measured air temperature is less than or equal to thirty-five degrees Celsius, go back to block 710. If the measured air temperature is greater than thirty-five degrees Celsius, then adjust the DX in block 770. The DX may be adjusted by setting a compressor speed, setting a hot gas bypass, setting a condenser blower speed, and/or setting a cold aisle blower speed. Thereafter, the cold aisle air temperature and pressure may be measured and the adjustments to the DX may be repeated. Finally, go back to block 710 and repeat at predefined intervals, such as once an hour, once every twenty minutes, or continuously.

Figure 8:
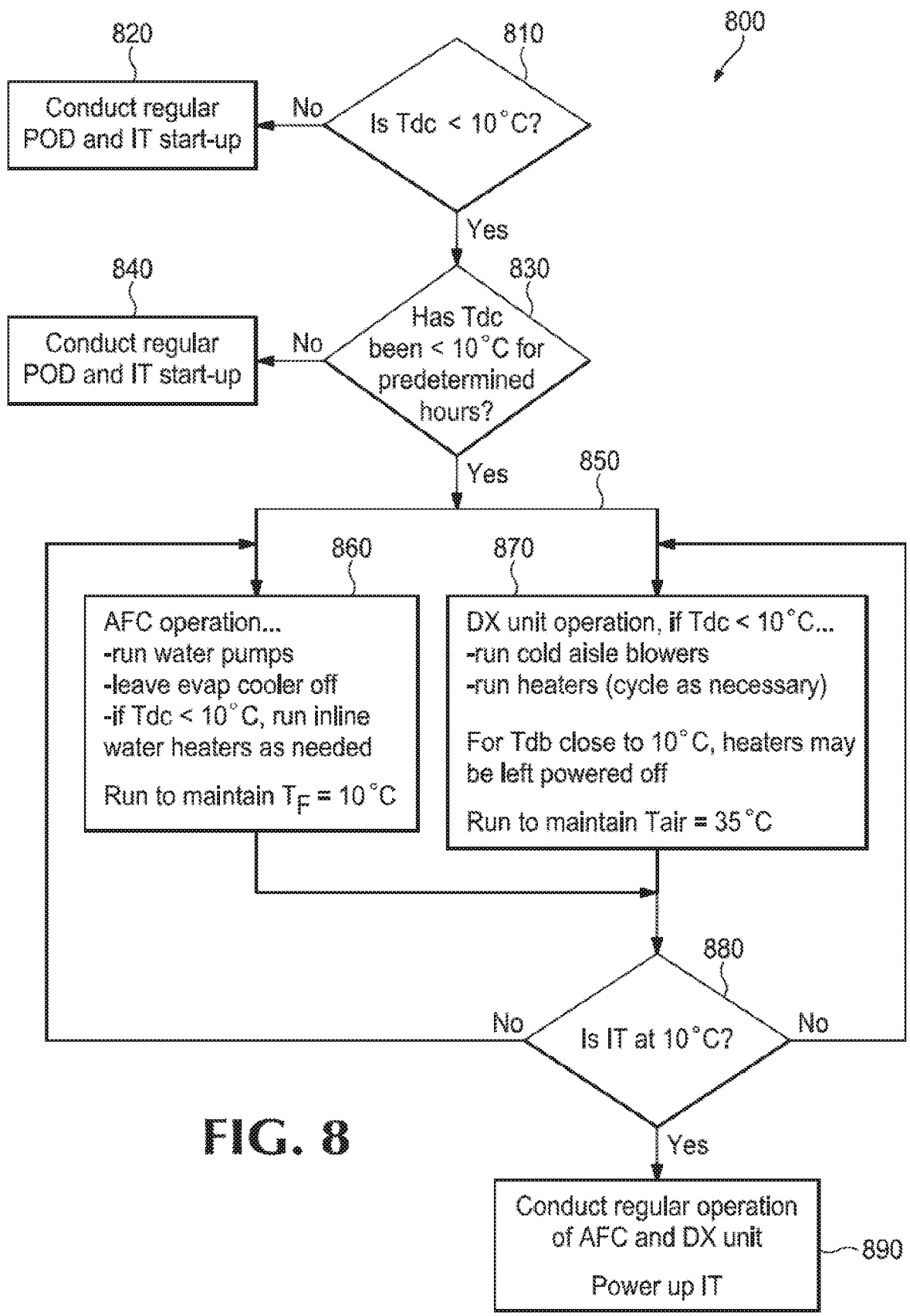
FIG. 8 illustrates a flow chart of a method to start a data center according to an example.

FIG. 8 illustrates a flow chart 800 of a method to start a data center according to an example. The method includes evaluating the environmental conditions surrounding the data center to determine a start-up sequence. Referring to FIG. 8, block 810 compares the temperature of the air in the data center. For example, if the temperature of the air is greater than or equal to a threshold temperature, such as ten degrees Celsius, the data center may be started normally, as indicated in block 820. However, if the temperature of the air is less than ten degrees Celsius, block 830 determines if the air temperature has been less than ten degrees Celsius for more than a predetermined number of hours, for example twelve hours. If the air temperature has not been below ten degrees Celsius for more than the predetermined number of hours, then the data center may be started normally, as indicated in block 840. If the temperature of the air is less than ten degrees Celsius for more than the predetermined number of hours, then a modified start-up is initiated as illustrated in the loop 850.

To initiate the AFC start-up operation, which includes running the water pumps may be run and the inline water heaters may be run as needed, while letting the evaporator cooler remain off, as illustrated in block 860. The AFC start-up operation may be set to maintain the fluid at ten degrees Celsius. The DX start-up operation is illustrated in block 870. The DX start-up includes running the cold aisle blowers and the heaters when the temperature of the air is less than ten degrees Celsius and not close to ten degrees Celsius. When the temperature of the air is close to ten degrees Celsius, the heaters do not need to be run. The DX start-up operation may be set to maintain the fluid at thirty-five degrees Celsius.

The temperature of the data center may be checked during the start-up loop 850, if the data center remains below ten degrees Celsius, then the loop 850 continues with blocks 860 and 870 and the data center is not powered up. In block 880, the temperature of the data center and the electronic components are evaluated. Once the data center and electronic components reach ten degrees Celsius, the AFC and DX, may be run normally and the data center and electronic components may be powered up, as illustrated in block 890.

Although the flow diagram of FIGS. 6-8 illustrate specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present disclosure.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims. "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A method to cool a modular data center comprising:
   obtaining an environmental condition using a sensing device, wherein the environmental condition includes an air temperature and a relative humidity;
   distributing a fluid at a fluid cooling temperature with a component-level fluid cooling device to remove a first portion of a rack heat load, the fluid cooling temperature based on the air temperature and the relative humidity; and
   circulating air at an air cooling temperature with an air cooling device to cool a second portion of the rack heat load, the air cooling temperature based on the air temperature and the relative humidity.

2. The method of claim 1, further comprising dynamically measuring and updating the environmental condition.

3. The method of claim 1, further comprising evaluating an environment surrounding a data center to determine a start-up sequence.

4. The method of claim 2, wherein dynamically measuring and updating the environmental condition comprises:
   comparing a measured wet bulb temperature to a threshold wet bulb temperature; and
   based on a determination that the measured wet bulb temperature is greater than the threshold wet bulb temperature, setting the air cooling temperature to a determined air temperature.

5. The method of claim 2, wherein dynamically measuring and updating the environmental condition comprises:
   based on a determination that the measured wet bulb temperature is less than or equal to the threshold wet bulb temperature:
      comparing a measured fluid temperature in the component-level fluid cooling device to a fluid temperature threshold; and
      based on a determination that the measured fluid temperature is greater than the fluid temperature threshold, adjusting the component-level fluid cooling device.

6. The method of claim 5, wherein the component-level fluid cooling device comprises an adiabatic fluid cooler including a wet media and a liquid to air heat exchanger, and wherein adjusting the component-level fluid cooling device comprises setting a water flow rate for evaporative cooling by the wet media and a flow rate through the liquid to air heat exchanger.

7. The method of claim 3, wherein dynamically measuring and updating the environmental condition comprises:
   based on a determination that the measured wet bulb temperature is less than or equal to the threshold wet bulb temperature:
      comparing a measured air temperature to an air temperature threshold; and
      based on a determination that the measured air temperature is greater than the air temperature threshold, adjusting the air cooling device.

8. The method of claim 7, wherein the air cooling device comprises a direct expansion compressor-based unit, and wherein adjusting the air cooling device comprises at least one of setting a compressor speed, setting a hot gas bypass, setting a condenser blower speed, and setting a cold aisle blower speed of the direct expansion compressor-based unit.

9. The method of claim 3, wherein evaluating the environment surrounding the data center to determine the start-up sequence comprises:
   comparing an air temperature of the data center with a threshold temperature;
   based on a determination that the air temperature is greater than or equal to the threshold temperature, starting the data center using a normal start-up operation;
   based on a determination that the air temperature is less than the threshold temperature:

based on a determination that the air temperature has not been less than the threshold temperature for a predetermined time period, starting the data center using the normal start-up operation; and based on a determination that the air temperature has been less than the threshold temperature for the predetermined time period, starting the data center using a modified start-up operation.

10. A method to cool a modular data center comprising:

obtaining an environmental condition using a sensing device, wherein the environmental condition includes an air temperature and a relative humidity;

distributing a fluid at a fluid cooling temperature with a component-level fluid cooling device to remove a first portion of a rack heat load from a first set of components of the modular data center, the fluid cooling temperature based on the air temperature and the relative humidity; and circulating air at an air cooling temperature with an air cooling device to cool a second portion of the rack heat load from at least one of the first set of components and from a second set of components of the modular data center, the air cooling temperature based on the air temperature and the relative humidity, wherein the first set of components is distinct from the second set of components.

* * * * *